United States Patent [19]

Rapp

[11] Patent Number: 4,541,077

[45] Date of Patent: Sep. 10, 1985

[54] SELF COMPENSATING ROM CIRCUIT

[75] Inventor: A. Karl Rapp, Los Gatos, Calif.

[73] Assignee: National Semiconductor Corporation, Santa Clara, Calif.

[21] Appl. No.: 440,921

[22] Filed: Nov. 12, 1982

[51] Int. Cl.³ ............................................. G11C 11/40
[52] U.S. Cl. .................................. 365/210; 365/104; 365/207
[58] Field of Search ............... 365/200, 210, 203, 207, 365/104

[56] References Cited

U.S. PATENT DOCUMENTS 4,371,956 2/1983 Maeda et al. .................... 365/210 X Primary Examiner—Joseph A. Popek
Attorney, Agent, or Firm—Gail W. Woodward; Paul J. Winters; Michael J. Pollock

[57] ABSTRACT

A compensation arrangement is shown for the diffused column line resistance in an N channel metal gate read only memory. The circuit employs a dummy column which has a transistor at each possible location operated from the same decoder that operates the metal gate rows. A current sense circuit clamps the column pull-up end of the dummy column line and provides a correction signal that is fed to the pull-up devices in the memory columns. A second current sense circuit clamps the dummy column sense amplifier end of the column line and provides a correction signal that can be used to compensate the reference currents in column sense amplifiers using differential current sensing.

10 Claims, 4 Drawing Figures

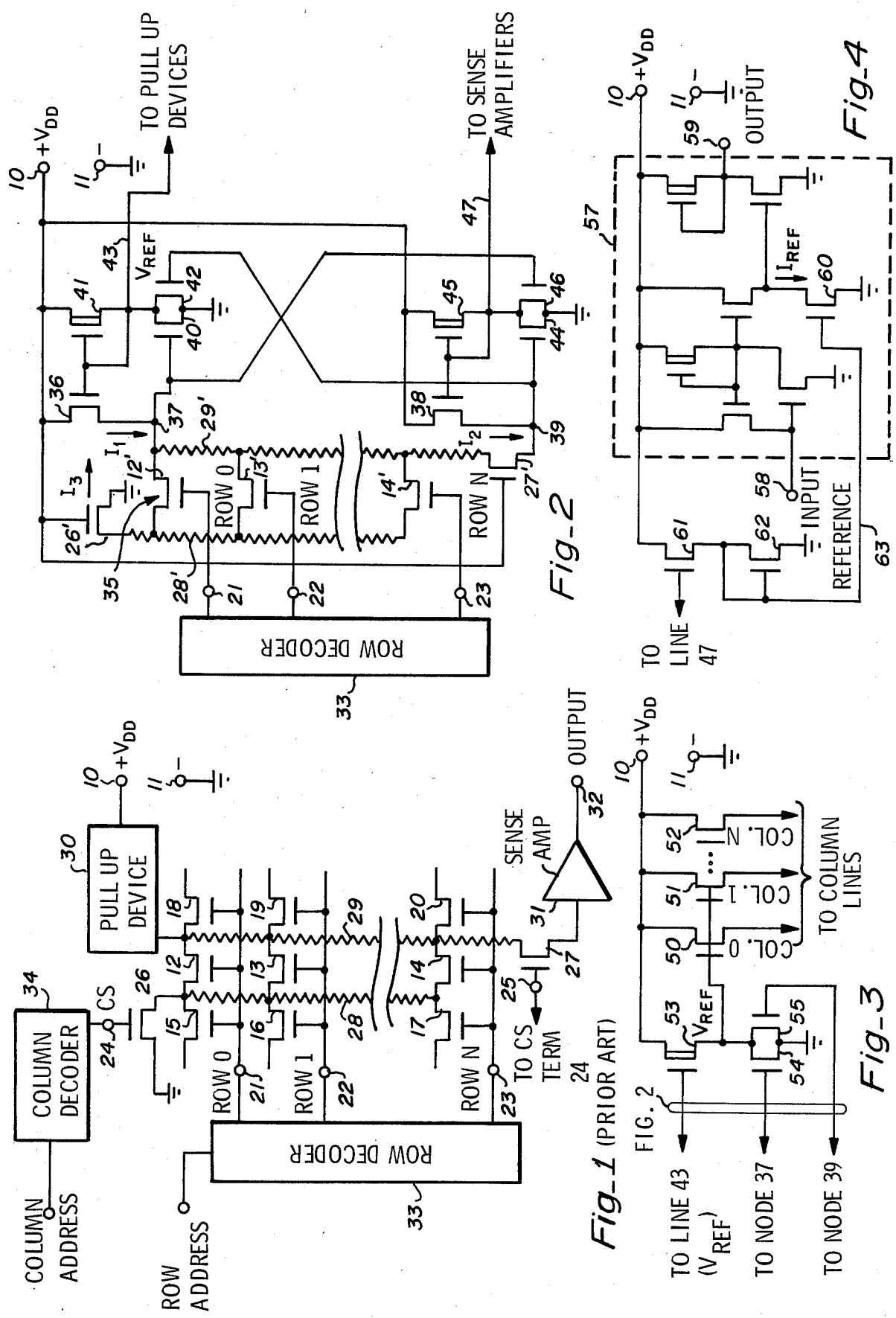

SELF COMPENSATING ROM CIRCUIT

BACKGROUND OF THE INVENTION

The invention relates to read only memory (ROM) circuits that employ metal-oxide-semiconductor (MOS) devices. In such circuits, an array of transistors is configured into rows and columns that can be selectively addressed so that each transistor in the array can be connected to the output circuit. During manufacture transistors are built into the array in a pattern that will provide the desired data. Where a transistor is present, a logic one is stored and the absence of a transistor indicates a stored logic zero. Thus, in the transistor making stage of manufacture the customer-determined logic is located in the ROM as a particular pattern of transistors. This pattern is located in what is called the memory-array section which is accessed and/or read using a peripheral section array of transistors interconnected to provide the desired functions.

One of the peripheral section array functions is the sense amplifier which can take the form disclosed in my copending application Ser. No. 391,255 filed June 23, 1982. This application which is titled Current Difference Sense Amplifier is assigned to the assignee of the present application, is now U.S. Pat. No. 4,464,591, which issued Aug. 7, 1984, and is incorporated herein by reference.

In semiconductor integrated circuit (IC) designs, the MOS approach is employed to create chips that have multiple individual components. These commonly employ the so called N channel field-effect transistor (FET) devices. Metal-gate device construction has been developed into a reliable high-speed low-cost form of construction that is highly suited to making ROM devices.

SUMMARY OF THE INVENTION

It is an object of the invention to provide a dummy column in a ROM array and to employ this column in conjunction with a pull-up circuit to develop a reference potential that will optimize the conduction of column pull-up transistors located at the periphery of the memory array.

It is another object of the invention to provide a dummy column in a ROM array and to employ this column in conjunction with current sensing using a differential current sense amplifier which has a reference current compensated by the dummy column.

These and other objects are achieved as follows. A memory array is configured in rows and column using N-channel metal-gate MOS construction. The rows and columns are addressed conventionally. One column is employed in a dummy configuration that includes an active transistor at each row location in the column and is connected to a combination pull-up and sense-amplifier simulator that operates to monitor the dummy column. The pull-up simulator produces a signal that can be used to optimize the operation of the memory section columns by controlling the conduction of the column pull-up devices and by generating a reference voltage that is proportional to the current conducted by a selected memory-array transistor. The sense amplifier simulator produces a signal that can be used to compensate the reference current in differential current sensing amplifiers. Since the dummy column is representative of all of the memory array columns, this compensation will be effective for the entire memory.

BRIEF DESCRIPTION OF THE DRAWING

FIG. 1 is a schematic diagram of the circuit employed in a memory using the prior art.

FIG. 2 is a schematic diagram of the circuit of the invention.

FIG. 3 is a schematic diagram of a buffer circuit useful in combination with the circuit of FIG. 2.

FIG. 4 is a schematic diagram of a circuit useful with the circuit of FIG. 2 in a memory that uses differential current sense amplifiers.

DESCRIPTION OF THE PRIOR ART

FIG. 1 shows a prior art circuit used in an MOS ROM. The circuit is operated from a $V_{DD}$ power supply connected between terminal 10 and ground terminal 11. The memory array is represented by transistors 12-20 which illustrate three representative columns. The transistor gates are connected in rows. Terminal 21 represents Row 0, Terminal 22 Row 1, and Terminal 23 Row N. One common architecture for a 64K ROM is 256 rows by 256 columns. The rows are addressed by way of row decoder 33. The columns are addressed by way of column decoder 34. Typically this is organized in the form of thirty two groups of eight each so that eight locations simultaneously can be read. Row decoder 33 will activate one row of the 256 rows in response to an address which is applied via an eight line input. While transistors are shown at each memory location it is to be understood that such transistor will exist only at those locations that contain a logic one. All other locations, for which a logic zero is present, would include a missing or at least an inoperative transistor. Terminals 24 and 25 are driven from column select (CS) decoder 34. This column decoding occurs at both ends of the column lines to provide the high packing density of the memory design.

Some of the older prior-art memory designs employed a permanently grounded line for every two columns of memory-array transistors, which resulted in a space between adjacent column pairs. Using the prior art shown eliminates the space and ground lines but does require the capability of switching each column conductor line.

The columns are addressed as thirty two groups of eight each. In effect such a 64K ROM is actually an eight bit wide by 8K memory device. This means that eight sense amplifiers 31 are needed to read out the ROM contents. Their outputs will represent an eight bit digital word.

When Terminals 24 and 25 are high, transistors 26 and 27 will thereby connect column lines 28 and 29 to the peripheral circuits. To read the memory contents out of the column represented by transistors 12-14, column line 28 is grounded by transistor 26 while transistor 27 connects column line 29 to sense amplifier 31. Then as row decoder 33 selectively energizes one of the rows, the memory location thus selected will be addressed and sensed.

Element 30 is a pull-up device which pulls the column lines toward $+V_{DD}$. While a pull-up device is shown only on the line being sensed it is to be understood that a pull-up device is connected to each column line. When a column is selected by decoder 34 the pull-up connected to the line that is grounded is overwhelmed by the grounding transistor conduction. Element 30 passes a small current that will act to re-charge the column lines to the positive potential they normally assume in the absence of any conducting ROM transistor. As was mentioned above, the preferred MOS process is N channel, in which case the column lines are diffused N type elements located in the semiconductor P type substrate. Such lines have appreciable resistance as shown and, also have distributed capacitance (not shown). Such characteristics tend to limit the maximum speed at which the lines, can be switched. To minimize the effects of shunt capacitance, it has become standard practice to employ current sensing in amplifier 31 and desirably the column-line voltage changes little during sensing. In this mode of operation, the line capacitance does not need to be charged or discharged through a large-voltage variation to get a read out signal. In a given memory array pull-up device 30 will provide a current based upon conflicting requirements which result in a compromised optimum. For example in the interest of rapidly recharging the column lines, the pull-up current is increased. However, since sense amplifier 31 must pass a like magnitude current, in order to sense the presence of transistors 12–14, the pull-up current which diverts potential sense-amplifier current should be kept low. Thus it is difficult to establish such a compromise. Also since the column lines extend for a substantial distance (256 memory locations) across the IC chip the optimum changes for each selected row.

DESCRIPTION OF THE INVENTION

FIG. 2 is a schematic diagram of the circuit of the invention. Where the element function is the same as that of FIG. 1 the same numerals are used.

Dummy column 35 is a portion of the IC chip that simulates a regular memory column and it is fabricated in the same way so as to simulate all of the characteristics of a memory column. Column lines 28' and 29' represent the conventional diffused elements while transistors 12'–14' represent transistors which are fabricated so that all of the simulated transistor locations do in fact contain a transistor. In a typical case, as described above, there would be 256 such transistors.

Transistors 26' and 27' simulate the column select devices of FIG. 1. Since they are always connected, their gates are returned to $+V_{DD}$. Transistor 36 simulates a pull-up device (30) for column line 29' and acts as a source follower to pass a current $I_1$, which flows into node 37. Transistor 38 simulates a sense amp (31) input current and, acting as a source follower passes, $I_2$, which flows into node 39. $I_1$ and $I_2$ will combine and flow through one of transistors 12'–14', whichever is turned on by row decoder 33, and then through transistor 26' to ground as $I_3$. As decoder 33 selects one of transistors 12'–14' it can be seen that different portions of column lines are invoked. Transistor 12' and 13' are at the upper end of column 35 while transistor 14' is at the opposite end. When transistor 12' is on $I_2$ flows through virtually all of line 29' and only a small portion of line 28' whereas $I_1$ flows through only a small portion of both lines 28' and 29'. Since the resistance of line 28' acts as a degeneration resistance in the source of transistor 12' its conduction will be little affected by such degeneration. When transistor 14' is on $I_2$ flows through only a small portion of line 29' and most of line 28' whereas $I_1$ also flows through most of both lines 28' and 29'. Thus the degeneration in line 28' is appreciable for this device.

Node 37, which directly receives $I_1$, is coupled to the gate of transistor 40. Depletion load transistor 41 operates with transistor 40 to create an inverter that drives the gate of source follower transistor 36. This combination forms an active negative feedback high gain loop around node 37 which will clamp its voltage at close to one transistor threshold ($V_T$). Conduction in transistor 36 will pull node 37 up until transistor 40 turns on sufficiently to pull the gate of transistors 36 down so as to limit its conduction to that level required to clamp node 37 close to $V_T$. Thus node 37 will be very close to one $V_T$ above ground and the gate of transistor 36 will be very close to $2V_T$ above ground.

A second clamping circuit based upon current flowing in source follower transistor 38 will also act to clamp node 39 at close to $V_T$ in the same manner. Node 39 is directly coupled to the gate of transistor 44 which in conjunction with depletion load 45 acts as an inverter driving source follower transistor 38 to complete a high gain negative feedback loop around node 39.

It can be seen that both ends of line 29' are clamped at close to $V_T$ by the actions of the two clamping circuits. Accordingly as different rows are operated the related voltage changes will be minimized and a current operated system is maintained. By way of example when row 0 is energized by decoder 33, conduction in transistor 12' will attempt to pull node 37 down. When row N is energized the current in transistor 14' will attempt to pull node 39 down but since this current must also flow through line 28' the pull-down effect at the node 39 is much smaller. When decoder 33 energizes a centrally located row (for example near row 128) both $I_1$ and $I_2$ will each flow through about half on line 29'. For this case the sum of $I_1$ and $I_2$ will flow though about half of line 28' (that portion between the source of the row selected transistor and the source of transistor 26').

Each of the clamping circuits include a second inverting transistor (transistor 42 and 46) in parallel with the inverting transistors 40 and 44. The gates of the second inverting transistors are coupled to the column node opposite to the one being clamped. Thus the two clamping circuits are cross coupled. As decoder 33 selects different rows the potentials at both nodes 37 and 39 will vary slightly. Since the transistors in the clamping circuits are all biased in their linear amplifying region (near their trip potentials), the variations will be small but discernible. For example as row 0 is selected the current flowing in transistor 12' will pull node 37 down slightly thereby lowering the gate of transistor 40. This will raise the drain potential of transistor 40 and the gate potential of transistor 36. Thus $I_1$ will increase to account for the proximity of transistor 12' to transistor 36 and the increase will appear as related to the potential at line 43. As row decoder 33 selects transistors in column 35 that are more remote from the top of the column the increase in $I_1$ will be less pronounced.

As shown above the pull-down effect of column 35 transistors on node 37 will increase $I_1$. The change in potential at node 37 is also coupled to the gate of transistor 46. As a result the drain of transistor 46 will rise thereby raising the gate of transistor 38 will pull node 39 up by an amount close to the drop at node 37. Thus the current $I_2$ in transistor 38 also will increase.

When row N is selected, and transistor 14' is turned on, its current will attempt to pull node 39 down but this pull down will be much less than the pull down of transistor 12' described above. This is due to the fact that all of line 28' will act to degenerate the conduction of transistor 14'. Due to the negative feedback loop the gate of transistor 38 will be raised so that $I_2$ will increase to accomodate the node 39 pull down. Also due to the action of transistor 42 the node 39 pull down will appear as an increase at node 37.

From the above it can be seen that as the action of row decoder 33 selects upper rows $I_1$ tends to increase relative to $I_2$ and as lower rows are selected $I_2$ tends to increase relative to $I_1$. Because of the cross-coupled connection, however, currents $I_1$ and $I_2$ are maintained approximately equal, independent of which row is selected.

The $V_{REF}$ on line 43 can be coupled to the column lines in the memory section, in which case the memory pull up will be compensated for row selection. Likewise the potential on line 47 can be coupled to each of the memory sense amplifiers to compensate their reference current values.

Because relative current relationships are maintained, independent of process-parameter variations, wide tolerance to manufacturing variables also is provided.

However, since a plurality of load devices must be compensated, the problem of capacitive loading is present. For example in the pull-up compensation, there is a pull-up device for each column line. The effects of pull-up loading of the compensation circuit can be minimized by using the circuit of FIG. 3.

The signal on line 43 is coupled directly to the gate of depletion transistor 53 which acts as a source follower. Transistors 54 and 55 act as a current sink load for transistor 53 which is made large enough to adequately drive the capacitive load. Transistors 50-52 represent column line pull-up devices. The sizes of transistors 54 and 55 are scaled to transistors 40 and 42 in the same ratio as 53 is to 41. This means that $V'_{REF}$ will closely approximate $V_{REF}$.

As pointed out above $I_2$ in transistor 38 which is connected to dummy column 35 simulates a sense amplifier input. In the event that the differential current sense amplifier disclosed and claimed in my copending application Ser. No. 391,255 filed June 23, 1982, (now U.S. Pat. No. 4,464,591) is used the dummy column can also be used to develop a compensated sense amplifier current reference as shown in FIG. 4.

Dashed outline 57 is a differential current sense amplifier and as such would be repeated for each ROM output circuit. For the 64 K memory described above there would be eight such circuits the outputs of which will represent the digits of an 8-bit binary word. Terminal 58 represents the input current connection that would be multiplexed by column decoder 34 and thereby coupled to the column being sensed. The sense amplifier will respond to this column current so that output terminal 59 will go high or low depending on the reading of a logic one or zero. The decision is based upon the input current relative to a reference current flowing in transistor 60. The plurality of reference current transistors in the array of sense amplifiers can be biased from a common reference line 63 as shown supplied by transistor 61. Transistor 61 is an enhancement device acting as a source follower that will introduce a $V_T$ offset and act to drive load transistor 62 and reference line 63. Since line 47 is connected to the gate of transistor 38, which is shown above to be clamped at close to $2V_T$ above ground, the reference line 63 potential of FIG. 4 will be close to $V_T$ so as to turn reference current sink 60 on. Since a substantial number of sense amplifiers may be supplied with reference potential as shown, transistor 62 should be a large area device. In operation the circuit of FIG. 4 will produce a reference current in each of the sense amplifiers that varies in accordance with the potential at node 39 of dummy row 35. As row decoder 33 selects transistors 12'-14' in dummy column 35, the variations of potential at node 39 will act to vary the reference current in the sense amplifiers. Since the sense amplifiers connected to the active memory section will be required to sense a current that will vary as a function of the row selected, such compensation of the reference current provides a more reliable sense amplifier readout.

EXAMPLE

The circuits of FIG. 2, 3, and 4 were constructed using the following device sizes:

| DEVICE | W/L (MICRONS) | DEVICE | W/L (MICRONS) |
|---|---|---|---|
|  |  | 46 | 75/5 |
| 36 | 20/5 | 53 | 28/8 |
| 38 | 20/5 | 54 | 300/5 |
| 40 | 75/5 |  |  |
| 41 | 7/8 | 55 | 300/5 |
| 42 | 75/5 | 61 | 50/5 |
| 44 | 75/5 | 62 | 200/6 |
| 45 | 7/8 |  |  |

A 64K memory was fabricated using conventional metal gate N channel devices. The row lines were metal gate lines and column lines were N type diffusions in a P type substrate. The device employed 256 rows and 256 column with one dummy column. The rows and columns were multiplexed for 8-bit words so that eight sense amplifiers were employed. The circuit was operated from a 5-volt supply. The variations in the voltages at nodes 37 and 39 produced variations in column pull-up currents and sense amplifier reference currents that compensated for the variations introduced by the various rows selected so that the device displayed substantially improved performance over that of an uncompensated memory.

The invention has been described and an example given. There are clearly alternativs and equivalents within the spirit and intent of the invention that will occur to a person skilled in the art upon reading the foregoing. Accordingly, it is intended that the scope of the invention be limited only by the claims that follow.

I claim:

1. In an MOS ROM integrated circuit memory chip having a memory section in which a plurality of transistors are located in an array of columns and rows, each of said columns including a pair of flanking diffused column lines and each of said rows including a metal transistor gate line, wherein said memory section includes an active transistor where a digital one is to be read out and an inactive or absent transistor where a digital zero is to be read out, and a peripheral section in which the circuits necessary to address and read said memory section are contained, the improvement comprising:

a dummy column created from a representative one of said columns;

an active transistor located at each memory location is said dummy column;

means for selectively energizing each transistor in said dummy column in a sequence that is the same as that employed in the rows in said memory section;

peripheral section circuitry coupled to said dummy column and responsive to said energizing sequence to generate a correction response signal related to the performance of said dummy column; and means for coupling said correction response signal to that portion of said peripheral section circuitry associated with said memory section columns whereby said memory section columns are compensated by said dummy column.

2. The improvement of claim 1 wherein said peripheral section circuitry coupled to said dummy column includes means for operating said column lines at substantially constant voltage.

3. The improvement of claim 2 wherein said peripheral section circuitry comprises;

$V_{DD}$ and ground supply lines connectible to a source of operating power;

a first pull-up transistor having a source coupled to one end of said column line of said dummy column, a drain coupled to said $V_{DD}$ line, and a gate;

a first inverting transistor having a drain coupled to said gate of said first pull-up transistor, a gate coupled to said source of said first pull-up transistor, and a source coupled to said ground line; and a depletion load transistor coupled between said drain of said first inverting transistor and said $V_{DD}$ line whereby said column line is clamped at a potential close to the threshold of said first inverting transistor.

4. The improvement of claim 3 wherein said means for coupling said correction response signal comprises:

pull-up transistors having their sources coupled to said column lines, their drains coupled in common to said $V_{DD}$ line, and their gates coupled in common to said drain of said inverting transistor.

5. The improvement of claim 4 wherein a source follower driver is coupled between said drain of said inverting transistor and said gates of said pull-up transistors whereby the capacitance associated with said gates is isolated from said inverting transistor.

6. The improvement of claim 3 further comprising a second inverting transistor having its source-drain circuit coupled in parallel with that of said first inverting transistor and a gate coupled to the other end of said dummy column line whereby said other end of said dummy column line is clamped at a potential close to that of the threshold of said second inverting transistor.

7. The improvement of claim 3 further comprising:

a second pull-up transistor having its source coupled to said other end of said dummy column line, a drain coupled to said $V_{DD}$ line, and a gate;

a third inverting transistor having its source coupled to said ground line, its drain coupled to said gate of said second pull-up transistor and a gate coupled to said source of said second pull-up transistor; and a depletion load transistor coupled between said drain of said third inverting transistor and said $V_{DD}$ line whereby said other end of said dummy column line is clamped at a potential close to the threshold potential of said third inverting transistor.

8. The improvement of claim 7 wherein said memory is sensed with a differential current sense amplifier and the potential at the drain of said third inverting transistor is used to control the value of the reference current in said differential current sense amplifier.

9. The improvement of claim 7 further comprising a fourth inverting transistor having its source-drain circuit coupled in parallel with that of said third inverting transistor and a gate coupled to said one end of said dummy column line.

10. The improvement of claim 9 further comprising a plurality of differential current sense amplifiers each one including a reference current transistor, means for connecting the gates of said reference transistor gates in parallel, and an isolation source follower coupled between said drain of said third inverting transistor and said gates of said reference current transistors.

* * * * *